United States Patent [19]

Kilby et al.

[11] E Re. 31,473

[45] Reissued Dec. 27, 1983

[54] SYSTEM FOR FABRICATION OF SEMICONDUCTOR BODIES

[75] Inventors: Jack S. Kilby, Dallas; William R. McKee, Plano; Wilbur A. Porter, College Station, all of Tex.

[73] Assignee: Texas Instruments Incorporated, Dallas, Tex.

[21] Appl. No.: 354,015

[22] Filed: Mar. 2, 1982

Related U.S. Patent Documents

Reissue of:

[64] Patent No.: 4,188,177
Issued: Feb. 12, 1980
Appl. No.: 766,223
Filed: Feb. 7, 1977

[51] Int. Cl.[3] ..... B29C 23/00; B29D 31/00

[52] U.S. Cl. ..... 425/6; 264/13; 425/DIG. 13

[58] Field of Search ..... 425/5, 6, 143, 404, 425/445, 446, DIG. 13; 264/5, 13, 26, 12; 156/604, 617 R, 617 H

[56] References Cited

U.S. PATENT DOCUMENTS

| | | | |
|---|---|---|---|
| 2,038,251 | 4/1936 | Vogt | 425/6 |
| 2,595,780 | 5/1952 | Dunlap | 264/12 |
| 2,911,672 | 11/1959 | Van Erven Dorens et al. | 425/5 |
| 2,935,386 | 5/1960 | Selker | 264/26 |
| 3,123,855 | 3/1964 | Fischer et al. | 425/6 |
| 3,160,686 | 12/1964 | Doyle et al. | 425/5 |
| 3,666,850 | 5/1972 | Windecker | 425/5 |
| 3,708,560 | 1/1973 | Mayer et al. | 264/13 |
| 3,715,418 | 2/1973 | Privott et al. | 264/13 |
| 3,753,661 | 8/1973 | Simons | 425/143 X |

FOREIGN PATENT DOCUMENTS

| | | |
|---|---|---|
| 1029940 | 6/1953 | France . |

*Primary Examiner*—Willard E. Hoag
*Attorney, Agent, or Firm*—Richards, Harris & Medlock

[57] ABSTRACT

A system and method is provided for forming semiconductor tear-drop shaped bodies having minimal grain boundaries. Semiconductor material is melted in a capillary tube at the top of a tower, and forced under gas pressure through a nozzle. Separate semiconductor bodies are formed. They are passed through a free fall path over which a predetermined temperature gradient controls solidification of the bodies. The resultant bodies are tear-drop semiconductor bodies of near uniform size with minimal grain boundaries.

3 Claims, 6 Drawing Figures

SYSTEM FOR FABRICATION OF SEMICONDUCTOR BODIES

Matter enclosed in heavy brackets [ ] appears in the original patent but forms no part of this reissue specification; matter printed in italics indicates the additions made by reissue.

FIELD OF THE INVENTION

The invention relates to forming small semiconductor bodies of simple grain structure.

PRIOR ART

In U.S. Pat. No. 4,021,323, assigned to the assignee of the present invention, an energy conversion system is disclosed which is comprised of a sheet of separate photovoltaic cells having tear-drop shaped semiconductor cores of one conductivity type, and outer diffusion layers of a second conductivity type. With such cells, much of the semiconductor material is within a diffusion length of the junction and thus within the active portion of the cell.

The efficiency of units employing tear-drop shaped photovoltaic cells is substantially increased when the semiconductor bodies are formed with minimal grain boundaries. The present invention provides sphere-like semiconductor bodies in which the number of grain boundaries is minimized.

SUMMARY OF THE INVENTION

In accordance with one embodiment of the invention a quartz capillary tube having a nozzle at the lower end is mounted with its axis vertical in a tower with a controlled atmosphere. A cylindrical graphite susceptor encircles the lower portion of the capillary tube to a point below the nozzle. Both the capillary tube and the graphite susceptor are enclosed in a quartz envelope which is mounted with its axis vertical. The upper end of the quartz envelope has a gas conduit connected thereto, and the lower end of the envelope converges to a collector cup structure having a gas purge conduit. An induction heater work coil encircles the glass envelope in the area of the graphite susceptor.

A semiconductor charge placed within the capillary tube is heated through electrical power applied to the work coil. An inert gas such as helium, is applied to the capillary tube and the glass envelope to purge the system of air. When the semiconductor material is in a molten state, the inert gas pressure is increased on the capillary tube to force the semiconductor material through the nozzle of the tube. Molten semiconductor bodies are formed thereby which fall the length of the glass envelope, and solidify before reaching the collector cup.

Control of particle shape and grain structure is achieved by use of either of two embodiments. In one embodiment the semiconductor bodies gathered in the collector cup are passed through a remelt tower to recrystallize the bodies and reduce the number of grain boundaries. More particularly, a quartz feed tube having a nozzle at the lower end is mounted vertically with its axis in the remelt tower. A cylindrical graphite feed tube encircles the quartz feed tube inside a hollow cylindrical graphite susceptor. The susceptor is supported with its axis vertical in the remelt tower. An inner cylindrical heat shield encompasses both the graphite susceptor and a lower portion of the graphite feed tube. An outer cylindrical heat shield encompasses the inner heat shield. A tubular fused quartz envelope encompasses the heat shields. An induction heater work coil preferably of hour glass shape encircles the quartz envelope in the area of the graphite susceptor.

Semiconductor particles enter into a feed tube and pass through the nozzle of the feed tube for free-fall through the graphite susceptor. Power applied to the work coil develops a temperature gradient along the susceptor to raise the temperature of the particles as they fall to a point above the melting point of the semiconductor material. The temperature then gradually decreases along the fall path until the temperature of the body is well below the freezing point. Semiconductor bodies formed in this manner have few grain boundaries and are quite suitable for a variety of uses such as in solar cell fabrication.

In a second embodiment of the invention, the shot forming tower and the remelt tower are unitary for both forming small semiconductor bodies and controlling the free-fall environment such that as they gradually cool, the particles achieve near uniform shape and minimal grain boundaries.

DESCRIPTION OF THE DRAWINGS

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

DESCRIPTION OF PREFERRED EMBODIMENTS

Figure 1:
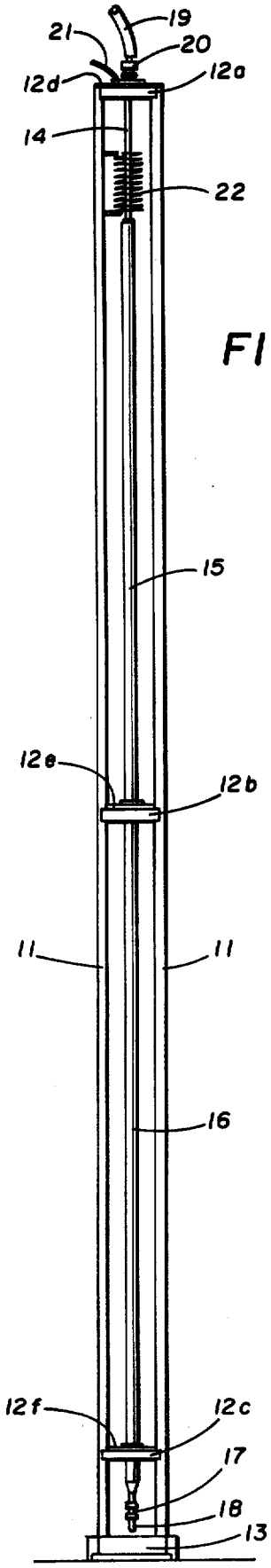
FIG. 1 is a cross-sectional view of a semiconductor particle forming tower in accordance with the invention.
Figure 2:
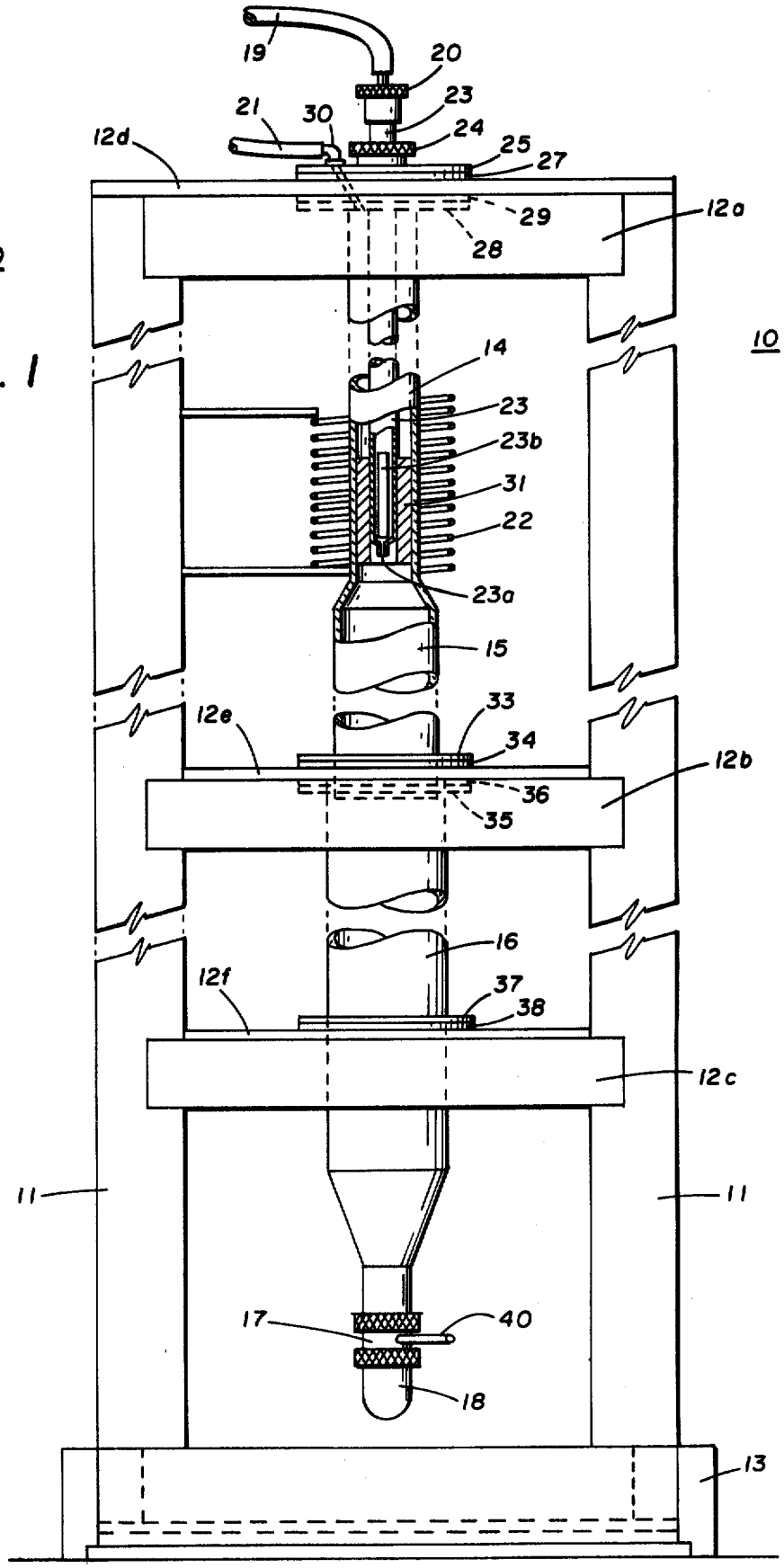
FIG. 2 is a cross-sectional view of selected sections of the tower of FIG. 1.

FIGS. 1 and 2

Referring to FIG. 1, a rectangular tower 10 has four corner posts 11 with frame members 12a-12c interconnecting the posts at three levels above a base 13. Floor plates 12d, 12e and 12f rest on frame members 12a, 12b and 12c, respectively. Plates 12d, 12e and 12f each have a central circular hole therethrough. A quartz tube 14 extends downward from plate 12d. The lower end of the tube is fused to a larger quartz tube 15. The lower end of tube 15 in turn extends into the upper end of a slightly larger quartz tube 16. The lower end of tube 16 is connected by means of a union 17 to a quartz collector cup 18.

A first gas feed tube 19 leads through a capillary end seal 20. A second gas feed tube 21 leads through a conduit 30 into the interior of tube 14.

An induction heating coil 22 encircles the lower end of tube 14. Heating coil 22 is connected to an induction heater (not shown), preferably of a type manufactured and sold by the Lapel High Frequency Laboratories, Inc. of New York, New York. In one embodiment, the induction heater had a power rating of 7½ kilowatts and was operated at 450 kilocycles.

Referring now to FIG. 2, capillary end seal 20 closes the upper end of a quartz capillary tube 23. Tube 23 extends through a capillary clamp 24 into the interior of tube 14. Clamp 24 is secured to a top cover plate 25. Cover plate 25 and a gasket 27 are secured to the top surface of floor plate 12d. The upper end of tube 14 is secured in a top clamp plate 28, which in turn is secured to the lower surface of floor plate 12d along with a gasket 29. Plates 25 and 28, and gaskets 27 and 29 may be secured to the top floor plate 12d by well known means such as bolt and nut combinations, not shown.

As above described, the feed tube 19 is flow connected to a conduit depending from the end seal 20. Feed tube 21 is flow connected to a conduit 30 passing through plates 25, 12d and 28 to the interior of tube 14. Both tubes 19 and 21 supply an inert gas such as helium at controlled pressures.

Capillary tube 23 converges to a nozzle 23a formed at the lower end thereof. A charge 23b of semiconductor material such as silicon is shown resting in the bottom of tube 23. In the preferred embodiment described herein, the nozzle has an inside diameter of about 5 mils. A cylindrical graphite susceptor 31 encircles a lower portion of tube 23, extending to a point slightly below nozzle 23a. Susceptor 31 is positioned inside the tube 14 and is heated by inductive coupling from coil 22.

Tube 15 extends downward through a center floor plate 12e and into the interior of tube 16. Tube 15 is secured to the upper surface of plate 12e by a clamp plate 33 and a gasket 34. Tube 16 is secured to the lower surface of plate 12e by a clamp plate 35 and a gasket 36. Plates 33 and 35, and gaskets 34 and 36 are secured to plate 12e by well known and suitable means.

Tube 16 extends through a clamp plate 37, a gasket 38 and a lower floor plate 12f. Plate 37 and gasket 38 are secured to plate 12f. The lower end of tube 16 converges to a union 17 which interconnects the tube 16 with collector cup 18. A gas purge tube 40 extends laterally from the union 17.

In operation, the capillary end seal 20 is removed from the end of tube 23, and one or more solid semiconductor bodies forming a charge are placed in the tube. The semiconductor charge is preferably a rod of solid silicon doped to provide particles of desired conductivity type and resistivity. The semiconductor charge rests at the bottom of tube 23, and is encircled by the graphite susceptor 31 and the work coil 22. The end seal 20 is replaced, and an inert gas, such as helium, under a pressure of a few pounds per square inch is then applied through the feed tubes 19 and 21 to quartz tubes 23 and 14, respectively. Initial flow of helium purges the system of air. The helium flows downward through both tubes, and exits at the conduit 40 which vents union 17. Electrical power applied to the heating coil 22 heats the graphite susceptor 31 which causes the charges to be heated. When the semiconductor charge is fully molten, helium gas again is applied through the feed tube 19 at a pressure of about 10 psig to force the molten material through the nozzle 23a. Flow of helium gas also is maintained through conduit 21 and tubes 14, 15 and 16 at a rate of about 10 cubic feet per hour to provide a controlled atmosphere in tubes 14–16. As the semiconductor material is discharged from nozzle 23a, it dissociates into small droplets which fall under the force of gravity along the length of tubes 15 and 16 to be collected in the collector cup 18.

With the nozzle 23a having an inside diameter of about 3–4 mils, the semiconductor bodies formed in tower 10 have a nominal diameter in the range of about 10 to 15 mils. It has been found that the droplets are generally characterized by an orange peel surface and a tail protruding from one end, and that numerous grain boundaries exist.

A remelt operation is then performed to improve the shape and grain structure as will now be described.

Figure 3:
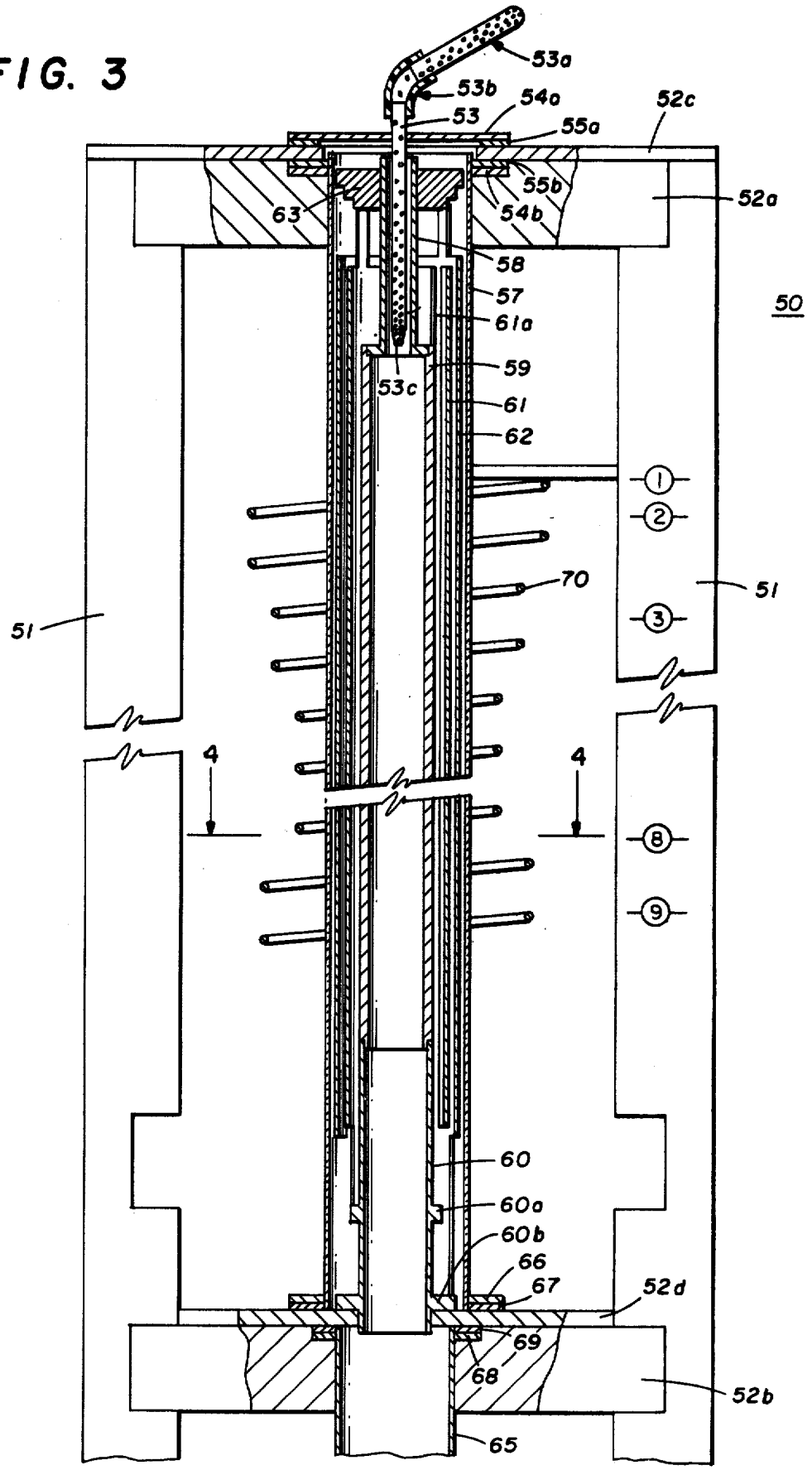
FIG. 3 is a cross-sectional view of selected sections of a remelt tower in accordance with the invention.
Figure 4:
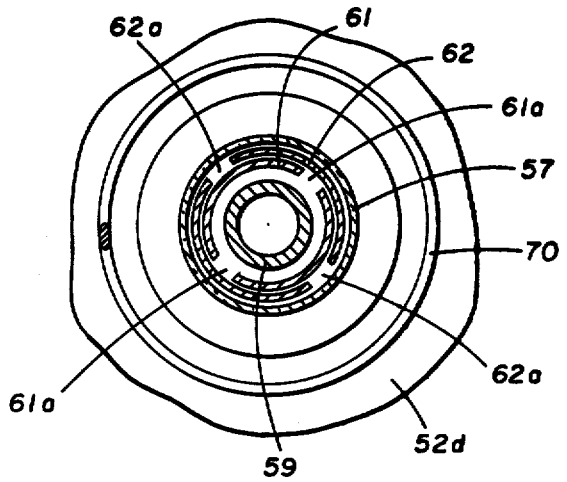
FIG. 4 is a cross-sectional view of the remelt tower of FIG. 3 taken along lines 4—4.

FIGS. 3 and 4

In FIG. 3, a remelt tower 50 includes a frame comprised of vertical posts 51 and cross frames 52a and 52b which support plates 52c and 52d. The tower 50 extends downward below cross frame 52b to a base such as shown in FIGS. 1 and 2. A quartz feed tube 53 is connected to a quartz vial 53a with a short length of flexible plastic tubing 53b. A nozzle 53c is at the lower end of feed tube 53. Tube 53 extends through top plate 54a, and a gasket 55a both supported on top plate 52c. Feed tube 53 extends axially within a quartz tube 57.

Tube 57 is secured to the top plate 52c by a clamp plate 54b and a gasket 55b. Plates 54a and 54b, and gaskets 55a and 55b are secured to plate 52c. Inside tube 57, a graphite tube 58 encircles a lower portion of tube 53 and extends to a point below nozzle 53c. The lower end of tube 58 is flanged and is seated within a recess in the upper end of a cylindrical graphite susceptor 59. Susceptor 59 is supported at the lower end thereof by a cylindrical graphite pedestal 60. An inner molybdenum shield 61 encircles a lower portion of the tube 58, the susceptor 59 and an upper portion of the pedestal 60. The inner shield consists of two half cylinders located on opposite sides of susceptor 59 with the edges thereof parallel and spaced apart leaving gaps 61a, as is best seen in FIG. 4. Both halves are supported by an upper annular flange 60a on the outer surface of the pedestal 60. The inner shield 61 in turn is encircled by a second molybdenum shield 62 which is intermediate to tube 57 and shield 61. Shield 62 is supported by a lower annular flange 60b on the outer surface of the pedestal 60. The shield 62 also consists of two halves with the gaps therebetween rotated 90 degrees from the gaps 61a in the inner shield 61 as shown in FIG. 4.

A graphite centering ring 63 encircles the tube 53, and is supported by vertical members of shields 61 and 62.

The pedestal 60 extends through a lower plate 52d into the interior of a lower quartz tube 65. The flange 60b abuts the top surface of plate 52d to support the pedestal 60. The tube 57 is laterally supported at plate 52d by a clamp 66 and a gasket 67. Plate 66 and gasket 67 are secured to plate 52d. Tube 65 is laterally supported at plate 52d by a clamp 68 and a gasket 69 contiguous to the under surface of plate 52d. The clamp 68 and gasket 69 also are secured to plate 52d. The structure of the tower 50 below cross member 52b is similar to that of tower 10 below cross member 12b, and thus need not be further described.

Below nozzle 53c and above the graphite pedestal 60, an induction heater work coil 70 of about 20 turns encircles the tube 57. It has been found that with an hour glass shaped coil, the occurrence of electrical arcs between the quartz tube 65 and the outer shields 62 is substantially decreased.

By way of example, in the embodiment shown in FIGS. 3 and 4, feed tube 53 was approximately 8 inches in length and 0.25 inches in diameter. The graphite feed tube 58 is approximately 8 in length, and has an inner diameter of about 1 inch. Further, the graphite susceptor 59 has a length of about 40 inches and an inner diameter of about 2.5 inches. The shields 61 and 62 have lengths of approximately 50 and 54 inches, respectively, and inner diameters of about 3 and 4 inches, respectively. The quartz tube 57 is approxmately 60 inches in length and 5 inches in diameter. The work coil 70 may be formed of ⅜" copper tubing, and is driven by a 60 Kw, 450 Kc induction heater (not shown) preferably of a type manufactured and sold by Taylor-Winfield, Warren, Ohio, Model S-6000LF.

An inert gas, such as helium or argon, is introduced into the tower through a fitting (not shown). When all of the air has been purged, as power is applied to the work coil 70 the graphite susceptor 59 is heated. The semiconductor bodies formed by the shot forming tower 10 of FIGS. 1 and 2 flow from the vial 53a into feed tube 53. The semiconductor bodies fall to the lower portion of tube 53 where they pile up and slowly feed through the exit at the nozzle 53c. The bodies then free-fall, passing through susceptor 59. Coil 70 controls the temperature gradient of susceptor 59 to maintain the temperature above the melting point of the semiconductor material over a path length which will ensure that each body is fully melted before leaving the hot zone within susceptor 59. The semiconductor bodies thus are melted as they travel the length of coil 70, and are resolidified as they fall through a controlled temperature gradient section at the lower end of susceptor 59. The process of melting and resolidifying in a controlled thermal gradient transforms the polycrystalline bodies produced in the process of FIGS. 1 and 2 into tear-drop shaped bodies of near uniform shape in which the number of grain boundaries is substantially decreased. An 0.010 inch diameter body treated in the tower of FIGS. 3 and 4 typically has five or less grains.

Referring to FIG. 4 and looking down onto the upper face of plate 52d, the work coil 70 encircles and is concentric to quartz tube 57. The tube 57 in turn encircles the molybdenum shield segments 62a and the shield segments 61 which are concentric to the graphite susceptor 59.

A suitable coil configuration involves approximately 20 turns wherein the outer diameter of the 3 upper turns is approximately 10 inches, followed by two turns having an outer diameter of approximately 8½ inches and 10 turns having an outer diameter of about 7½ inches and two turns having an outer diameter of approximately 8½ inches. The lower 4 turns of the coil have an outer diameter of about 9 inches.

FIG. 5

Figure 5:
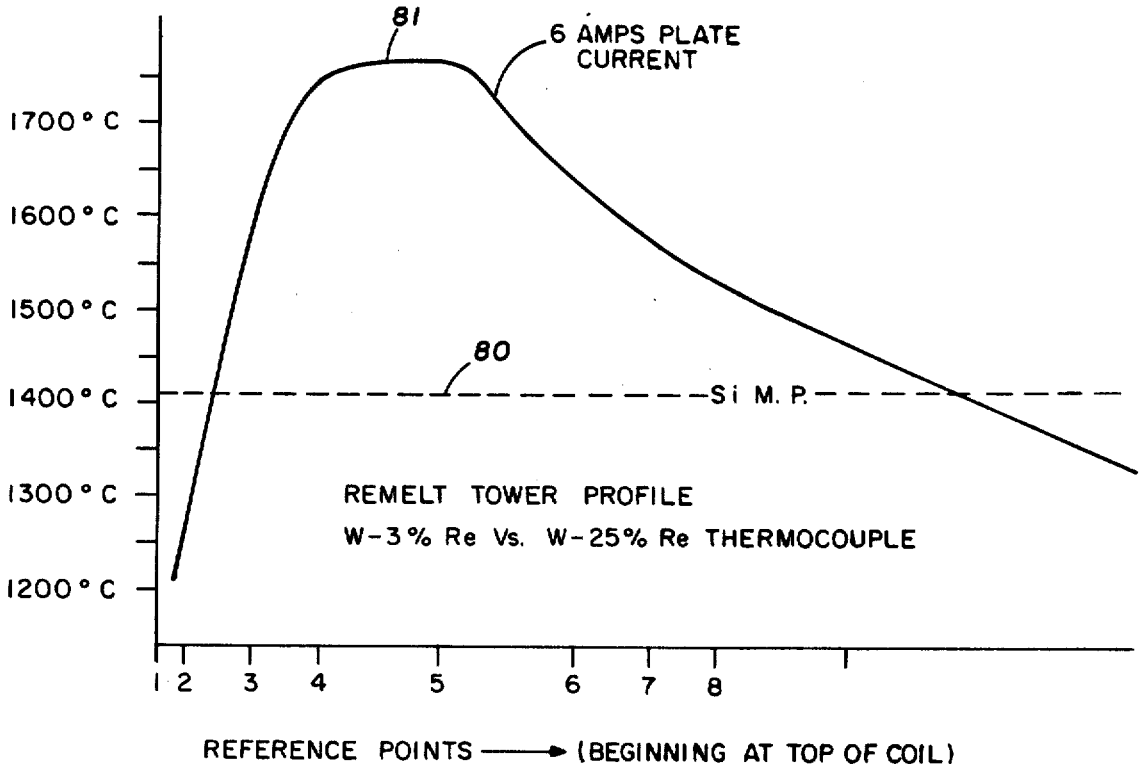
FIG. 5 is a temperature gradient graph taken along the length of the remelt tower heater coil of FIG. 3.

FIG. 5 illustrates graphically the temperature gradient along the free fall path through the work coil 70 of FIG. 3.

Referring to FIG. 5, the temperature profile is illustrated on a scale identified in terms of reference points along the length of coil 70.

Reference point 1, at the upper end of the coil, is approximately 5½ inches below the nozzle 53b.

Reference point 2 is approximately 1½ inches below the reference point 1.

Reference point 3 is approximately 3½ inches below the reference point 2.

Reference point 4 is approximately 3½ inches below the reference point 3 and reference point 5 is about 7 inches below the reference point 4.

Reference point 6 is about 7 inches below the reference point 5, and reference point 7 is about 3½ inches below reference point 6.

Reference point 8 is approximately 3½ inches below the reference point 7, and reference point 9 is about 2 inches below the reference point 8. Reference point 9 is at the lower end of the coil 70. Reference points 1, 2, 3, 8 and 9 are shown at representative levels in FIG. 4.

A horizontal dotted line 80 of FIG. 5 indicates the melting point of silicon, i.e., 1410 degrees C. Thus it will be appreciated that the system operates to apply heat to the bodies as they traverse the free-fall path in a controlled way to make more uniform the internal structure.

In FIG. 3 the turns of work coil 70 are more closely spaced near the top relative to those near the bottom of the coil in order to control the temperature profile in the susceptor 59 in the manner indicated by curve 81 of FIG. 5. The temperature profile may be measured by inserting a tungsten-rhenium thermocouple in place of feed tube 53. By use of a 60 Kw induction heater of the type manufactured and sold by Taylor-Winfield, the desired temperature profile 81 was reached with the 60 Kw heater set for full output. In preferred form, the temperature gradient of curve 81 over the portion of negative slope is about 35 to 30 degrees per inch.

This profile provides fast heating of the falling bodies. It is also shaped to assure that the bodies are cooled slowly as they pass through the silicon melting point.

Final adjustment of the operating conditions may be established by examination of bodies which have passed through the tower. Bodies which have been properly remelted and resolidified have a tear drop shape and a very smooth surface. If the bodies are not completely melted, the peak temperature should be increased. Bodies subjected to temperatures which are too high will have a rough surface. Small bodies may require lower temperatures than largsr ones.

Semiconductor materials such as silicon and germanium expand upon cooling. When they cool rapidly, as in the tower of FIGS. 1 and 2, it is believed that an outer skin is formed over a molten core. As the core solidifies, the skin is ruptured and the excess material is expelled to form an attached secondary protrusion. Although the change in shape is of little significance, bodies of this type are usually highly polycrystalline, sometimes containing as many as 10,000 crystalletes in an 0.010 inch diameter sphere.

It is believed that the beneficial results of the remelting operation performed in the tower of FIG. 3 occur because the cooling is directional. That is, the freezing is initiated at one point at or near the surface of the body and progresses until all of the material is solidified. Because the semiconductor material expands upon freezing, material is pushed ahead of the solid-liquid interface, resulting in a particle with a "raindrop" or "tear drop" shape. "Tear-drop" shaped crystals frequently are single crystals, usually have less than five crystalletes in an 0.010 inch body. It has been found that "tear-drop" shaped crystals make excellent solar cells, with air mass 1 efficiencies greater than 10%.

Although the embodiments described are for silicon, other semiconducting materials may be formed in the same manner. Germanium solidifies at about 950 degrees C., so the temperatures indicated should be reduced accordingly. Materials like gallium arsenide may require constant pressurization due to the volatility of arsenic. Such procedures are well known to those skilled in the art.

FIG. 6

Figure 6:
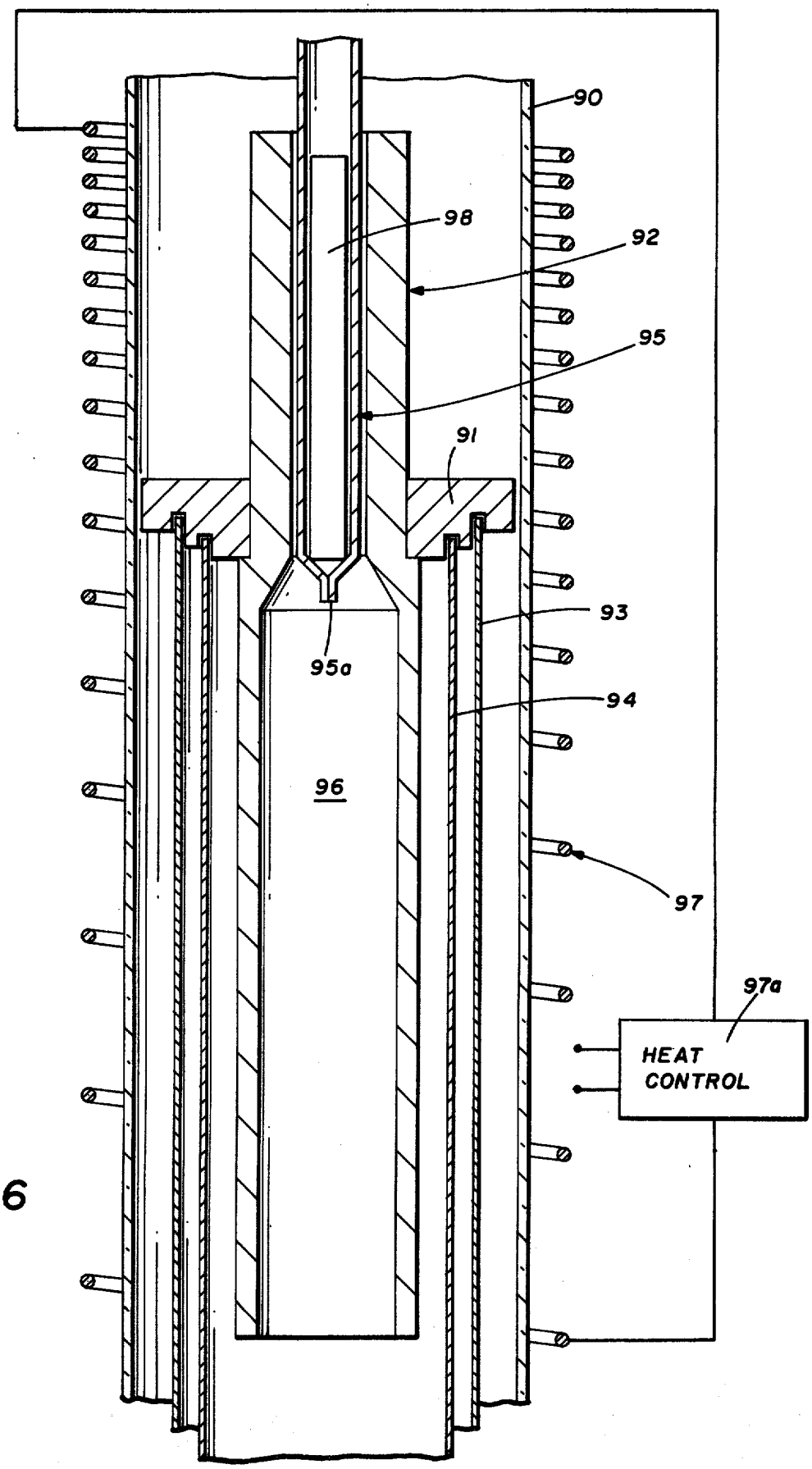
FIG. 6 is a second embodiment of the invention wherein the forming tower of FIG. 1 and the remelt tower of FIG. 3 are combined into a unitary tower structure.

FIG. 6 illustrates a unitary structure combining the function of the tower of FIGS. 1 and 2 and the remelt tower of FIG. 3.

Referring to FIG. 6, a quartz tube 90 is shown. An insulating ring 91, preferably of alumina, is centered in tube 90. Insulating ring 91 supports and locates a susceptor of graphite 92, and two heat shields 93 and 94, segmented and oriented like shields 61a and 62a, FIG. 4. A quartz capillary 95, which may be identical to capillary 23 of FIG. 2, is centered in the upper end of susceptor 92.

The nozzle 95a of the capillary extends into an open area 96 of susceptor 92. The lower end of the susceptor 92 is supported by means including an upfacing insulating ring not shown but similar to ring 91.

Work coil 97 surrounds tube 90, and extends the full length of the susceptor 92. The turns at the top are closer together than therebelow, so that the temperature at the top, surrounding the capillary 95, is higher than that of the bottom end of capillary 95 by approximately 100 degrees C. Work coil 97 will be shaped as a combination of coils 22 and 70 (FIGS. 1 and 4) and may be driven by a 25 Kw 450 Kc induction heat control 97a. A suitable unit is made by Taylor-Winfield.

In operation, a semiconductor charge 98 is placed in capillary 95. Thereafter, tubes 95 and 90 are purged with inert gas such as helium or argon. Electrical power is then applied to heater coil 97. When the charge 98 is molten, inert gas at a pressure of 10 psi is applied to capillary 95. The semiconductor bodies formed at nozzle 95a fall freely through region 96 of susceptor 92, and solidify near the lower end to the susceptor. The solidified bodies continue to fall, and are collected in a cup similar to cup 18 of FIG. 2.

The temperature gradient in zone 96 is of the character shown by the negative slope portion of the curve 81 of FIG. 5.

It is to be understood that the embodiments herein described are illustrative of the invention. Other arrangements may be devised by those skilled in the art without departing from the spirit and scope of the invention as defined by the appended claims.

What is claimed is:

[1. A system for fabricating small semiconductor bodies, which comprises:

(a) a capillary tube having heat transmissive properties for receiving a solid charge of semiconductor material and having a nozzle for discharging the semiconductor material;

(b) an outer tube enclosing said capillary tube;

(c) a heat susceptor internal to said outer tube and encircling said capillary tube;

(d) heating means for energizing said heat susceptor to render said charge molten; and (e) means to pressurize said capillary to force said molten charge through said nozzle.]

[2. The combination set forth in claim 1, wherein: a removable end seal is connected to the upper end of said capillary tube.]

[3. The combination set forth in claim 2, wherein said outer tube has a gas port for flow of purge gas through said system.]

[4. A system for forming small semiconductor bodies of near uniform size with minimal grain boundaries from bodies of semiconductor material, which comprises:

(a) a feed tube for receiving said bodies;

(b) a heat susceptor encircling said feed tube and encompassing a free fall path below said feed tube;

(c) a tube enclosing said susceptor; and (d) heating means encircling said tube for establishing a temperature level near said feed tube above the melting point of said semiconductor material and establishing a predetermined temperature gradient over the next lower portions of said free fall path to a temperature below said melting point.]

[5. The combination set forth in claim 4, wherein] *A system for forming small semiconductor bodies of near uniform size with minimal grain boundaries from bodies of semiconductor material, which comprises:*

*(a) a feed tube for receiving said bodies;*

*(b) a heat susceptor encircling said feed tube and encompassing a free fall path below said feed tube;*

*(c) a tube enclosing said susceptor; and*

*(d) heating means encircling said tube for establishing a temperature level near said feed tube above the melting point of said semiconductor material and establishing a predetermined temperature gradient over the next lower portions of said free fall path to a temperature below said melting point,* said heating means [is] *being* an induction heating coil of uneven diameter and turn density along the length thereof for maintaining said temperature level and gradient over said free fall path.

[6. A system for forming small semiconductor bodies having near uniform size and minimal grain boundaries from a charge of semicondcutor material, which comprises:

(a) a capillary tube converging at the lower end to form a nozzle;

(b) a cylindrical heat susceptor encircling the lower portion of said capillary tube;

(c) an elongated tube encircling said heat susceptor and said capillary and encompassing a free fall path below said nozzle of a length to accommodate the solidification of molten semiconductor bodies issuing from said nozzle;

(d) further heat susceptor structure axially aligned with said tube along said free fall path;

(e) a pair of split heat shields concentric to each other and encircling said further heat susceptor structure; and (f) heating structure encircling said elongated tube in the area of said heat susceptor for melting said charge and extending along said further heat susceptor structure for establishing an atmosphere of controlled temperature gradient in the region of said further heat susceptor structure where the temperature decreases to a point below the melting point of said semiconductor.]

[7. The Combination set forth in claim 6, wherein] *A system for forming small semiconductor bodies having near uniform size and minimal grain boundaries from a charge of semiconductor material, which comprises:*

*(a) a capillary tube converging at the lower end to form a nozzle;*

(*b*) *a cylindrical heat susceptor encircling the lower portion of said capillary tube;*

(*c*) *an elongated tube encircling said heat susceptor and said capillary and encompassing a free fall path below said nozzle of a length to accommodate the solidification of molten semiconductor bodies issuing from said nozzle;*

(*d*) *further heat susceptor structure axially aligned with said tube along said free fall path;*

(*e*) *a pair of split heat shields concentric to each other and encircling said further heat susceptor structure; and*

(*f*) *heating structure encircling said elongated tube in the area of said heat susceptor for melting said charge and extending along said further heat susceptor structure for establishing an atmosphere of controlled temperature gradient in the region of said further heat susceptor structure where the temperature decreases to a point below the melting point of said semiconductor,* said heating means [is] *being* an induction heater work coil of uniform diameter at the top and hour*glass shape therebelow.*

8. The combination set forth in claim 7, wherein said free fall path is of a length and the temperature is at levels therealong to slowly solidify said bodies.

[9. The combination set forth in claim 6 said capillary tube has a gas port and the upper end of said tube has a gas conduit leading thereto for selective flow of inert gas into said capillary tube and said elongated tube.]

* * * * *